United States Patent
Jayatilaka et al.

(10) Patent No.: US 6,780,771 B1
(45) Date of Patent: Aug. 24, 2004

(54) FORMING A SUBSTANTIALLY PLANAR UPPER SURFACE AT THE OUTER EDGE OF A SEMICONDUCTOR TOPOGRAPHY

(75) Inventors: Venuka K. Jayatilaka, Farmington, MN (US); Matthew D. Buchanan, Edina, MN (US); Ruediger Held, Minneapolis, MN (US)

(73) Assignee: Cypress Semiconductor Corp., San Jose, CA (US)

( * ) Notice: Subject to any disclaimer, the term of this patent is extended or adjusted under 35 U.S.C. 154(b) by 253 days.

(21) Appl. No.: 09/768,873

(22) Filed: Jan. 23, 2001

(51) Int. Cl.$^7$ ................ H01L 21/302; H01L 21/461
(52) U.S. Cl. .............. 438/690; 438/691; 438/692
(58) Field of Search ................. 438/690, 691, 438/692, 699

(56) References Cited

U.S. PATENT DOCUMENTS

| | | | |
|---|---|---|---|
| 4,193,226 A | | 3/1980 | Gill, Jr. et al. ........... 451/276 |
| 4,811,522 A | | 3/1989 | Gill, Jr. ................... 451/285 |
| 5,421,769 A | | 6/1995 | Schultz et al. ............ 451/285 |
| 5,783,482 A | * | 7/1998 | Lee et al. ................. 438/624 |
| 5,918,139 A | * | 6/1999 | Mitani et al. ............. 438/459 |
| 6,010,964 A | | 1/2000 | Glass ..................... 156/345.12 |
| 6,020,639 A | * | 2/2000 | Ulrich et al. ............. 257/735 |
| 6,091,130 A | * | 7/2000 | Oyamatsu et al. ......... 257/618 |
| 6,376,363 B1 | * | 4/2002 | Iguchi .................... 438/633 |
| 6,472,291 B1 | * | 10/2002 | Page et al. ............... 438/424 |

OTHER PUBLICATIONS

Stanley Wolf Ph.D. in Silicon Processing for the VLSI Era, vol. 2: Process Integration, Lattice Press, 1990, pp. 238–239.*

Malkoe et al., "Effect of Retaining Ring System on the Polishing of 300 mm Oxide Wafers," Mar. 2001, pp. 519–522.

* cited by examiner

Primary Examiner—Olik Chaudhuri
Assistant Examiner—William M. Brewster
(74) Attorney, Agent, or Firm—Kevin L. Daffer; Conley Rose P.C.

(57) ABSTRACT

A method is provided for processing a semiconductor topography such that its upper surface is substantially planar, particularly including a region adjacent to an outer edge of a semiconductor topography. The method may include preferentially removing a portion of an upper layer of the topography in a region adjacent to an outer edge of the semiconductor topography. The region may extend greater than approximately 3 mm inward from the outer edge of the semiconductor topography. The method may also include polishing the semiconductor topography such that the upper surface of the semiconductor topography is substantially planar. Therefore, although a rate of polishing adjacent to an outer edge of the semiconductor topography may be slower than a rate of polishing adjacent to a center of the semiconductor topography, a thickness variation of the polished upper layer across the entirety of the semiconductor topography may be less than approximately 500 angstroms.

20 Claims, 4 Drawing Sheets

FORMING A SUBSTANTIALLY PLANAR UPPER SURFACE AT THE OUTER EDGE OF A SEMICONDUCTOR TOPOGRAPHY

BACKGROUND OF THE INVENTION

1. Field of the Invention

This invention relates to semiconductor device manufacturing, and more particularly, to improved methods for processing a semiconductor topography having a substantially planar upper surface.

2. Description of the Related Art

The following descriptions and examples are not admitted to be prior art by virtue of their inclusion within this section.

Fabrication of an integrated circuit involves numerous processing steps. After implant regions (e.g., source/drain regions) have been placed within a semiconductor substrate and gate areas defined upon the substrate, an interlevel dielectric is formed across the topography to isolate the gate areas and the implant regions from overlying conducting regions. Interconnect routing is then placed over the interlevel dielectric and connected to the implant regions and/or the gate areas by ohmic contacts formed through the interlevel dielectric. Alternating levels of interlevel dielectric and interconnect may be placed across the semiconductor topography to form a multi-level integrated circuit.

Forming substantially planar upper surfaces of a semiconductor topography during intermediate process steps may facilitate fabrication of layers and structures that meet design specifications. For example, a dielectric layer may be formed across a previously patterned layer of a semiconductor topography using a process such as chemical vapor deposition ("CVD"). Elevational disparities of the deposited dielectric layer may be reduced by planarizing the deposited dielectric layer using a process such as chemical mechanical polishing ("CMP"). A contact opening may be formed within the planarized dielectric layer and subsequently filled with a layer of conductive material. In this manner, the layer of conductive material may be formed within the contact opening and on an upper surface of the planarized dielectric layer. As such, the layer of conductive material may also be planarized such that an upper surface of the contact structure may be substantially planar with an upper surface of the dielectric layer.

Additional layers and structures may be formed upon the contact structures and the dielectric layer. The additional layers and structures may include, for example, additional dielectric layers, additional contact structures, local interconnect wires, and/or metallization layers. In this manner, the planarized upper surface of the contact structures and the dielectric layer may facilitate the formation of such additional layers and structures having uniform vertical and lateral dimensions. For example, the planarization of the semiconductor topography may facilitate the formation of local interconnect structures having a substantially uniform thickness by providing a planar surface upon which a dielectric material may be deposited to insulate adjacent local interconnect structures. Moreover, the planarization of the semiconductor topography may aid in forming local interconnect structures having uniform lateral dimension by providing a planar surface upon which a patterned masking layer may be formed. In this manner, a masking layer may be accurately patterned by a lithography technique such that the pattern may be accurately transferred to a dielectric layer to form local interconnect structures. Accordingly, layers and structures of a semiconductor device may be formed having dimensions which are approximately equal to design specifications for the semiconductor device.

Forming a substantially planar upper surface of such layers and structures may play an important role in the functionality of a semiconductor device. For example, problems with step coverage may arise when a dielectric, conductive, or semiconductive material is deposited over a topological surface having elevationally raised and recessed regions. Step coverage is defined as a measure of how well a film conforms over an underlying step and is expressed by the ratio of the minimum thickness of a film as it crosses a step to the nominal thickness of the film over horizontal regions. Furthermore, substantially planar surfaces may become increasingly important as the feature sizes of semiconductor devices are reduced, since the depth of focus required to pattern an upper surface of a semiconductor topography may increase with reductions in feature size. If a topography is nonplanar, the patterned image may be distorted and the intended structure may not be formed to the specifications of the device. Furthermore, correctly patterning layers upon a topological surface containing fluctuations in elevation may be difficult using optical lithography. The depth-of-focus of the lithography alignment system may vary depending upon whether the resist resides in an elevational "hill" or "valley" area. The presence of such elevational disparities therefore makes it difficult to print high-resolution features.

As mentioned above, CMP is a technique commonly employed to planarize or remove the elevational fluctuations in the surface of a semiconductor topography. A conventional CMP process may involve placing a semiconductor wafer facedown on a polishing pad, which lies on or is attached to a rotatable table or platen. A typical polishing pad medium may include polyurethane or polyurethane-impregnated polyester felts. During the CMP process, the polishing pad and the semiconductor wafer may be rotated relative to each other as the wafer is forced against the pad. An abrasive, fluid-based chemical suspension, often referred to as a "slurry," may be deposited onto the surface of the polishing pad. The slurry fills the space between the polishing pad and the wafer surface such that a chemical in the slurry may react with the surface material being polished. The rotational movement of the polishing pad relative to the wafer causes abrasive particles entrained within the slurry to physically strip the reacted surface material from the wafer. Alternatively, a liquid substantially free of particulate matter may be deposited onto the polishing pad during polishing. In addition, the pad itself may physically remove some material from the surface of the semiconductor topography. Therefore, the process may employ a combination of chemical stripping and mechanical polishing to form a planarized surface.

Unfortunately, a CMP process may not form a substantially planar surface across an entire semiconductor topography. For example, if the polishing rate of CMP varies across a topography, a planarized semiconductor topography may have substantial elevational disparities. Such disparities may be particularly prevalent at an edge of the topography. For example, a thickness of a semiconductor topography may be greater at the edge of the topography than at an inner portion of the topography. The greater thickness of the semiconductor topography at its edge may be due to a slow polish rate at the edge of the topography as compared to polish rates at other regions of the topography. Several factors may influence the polish rates of a CMP process. For example, the polish rates may depend on the pressure used to force the semiconductor topography against a polishing pad during CMP. The pressure may be greater near the inner portion of the wafer than at the edge of the wafer. In fact, the edge of the semiconductor topography may not contact the pad due to pad distortions that may occur from the pressure used to force the topography against the pad. In this manner, the outer portions of the semiconductor topography may not be polished at the same rate as inner portions of the semiconductor topography. Additional factors which may affect polish rates of the CMP process may include the polishing tool, the pad materials, the slurry, the surface materials being polished, and the rotational and lateral movement of the polishing pad relative to the semiconductor topography.

Elevational disparities which may be present on a semiconductor topography subsequent to chemical mechanical polishing may inhibit the formation of semiconductor devices on a portion of the semiconductor topography. For example, a thickness of the semiconductor topography may be greater at an outer edge of the semiconductor topography than at an inner portion of the semiconductor topography. As such, the thickness of the semiconductor topography at the outer edge may be outside of design specifications for a semiconductor device. Consequently, semiconductor devices formed at the outer edge of such a semiconductor topography may have dimensions which deviate significantly from design specifications. In this manner, acceptable devices may not be formed on an area of the semiconductor topography having such elevational disparities, thereby reducing the number of devices which may be formed on the semiconductor topography. As such, the presence of such elevational disparities on a semiconductor topography may reduce manufacturing yield and may increase production costs per semiconductor device.

Accordingly, it would be advantageous to develop a method for forming a semiconductor topography having a substantially planar upper surface across substantially the entire semiconductor topography including its outer edge.

SUMMARY OF THE INVENTION

The problems outlined above may be in large part addressed by a method for processing a semiconductor topography such that its upper surface is substantially planar. In particular, a method is provided in which a substantially planar upper surface in a region adjacent to an outer edge of a semiconductor topography may be formed. According to an embodiment, the method may include preferentially removing a portion of an upper layer of the topography in a region adjacent to an outer edge of the semiconductor topography. The removed portion may extend greater than approximately 3 mm inward from the outer edge of the semiconductor topography. In one embodiment, the removed portion may extend approximately 6 mm inward from the outer edge of the semiconductor topography. Removing the upper layer may include etching a portion of the upper layer. For example, the removed portion may have an average thickness of approximately 5% to approximately 30% of the average thickness of the upper layer. The method may also include polishing the semiconductor topography such that the upper surface of the semiconductor topography is substantially planar. In this manner, the thickness of the polished upper layer of the semiconductor topography may be approximately the same across the entirety of the semiconductor topography. Therefore, although a rate of polishing adjacent to an outer edge of the semiconductor topography may be slower than a rate of polishing adjacent to a center of the semiconductor topography, a thickness variation of the polished upper layer across the entirety of the semiconductor topography may be less than approximately 500 angstroms. In one embodiment, the thickness variation of the polished upper layer across the entirety of the semiconductor topography may be less than approximately 125 angstroms.

In an embodiment, the semiconductor topography may include a semiconductor substrate such as a monocrystalline silicon substrate. Such a substrate may preferably be in the form of a semiconductor wafer. The semiconductor topography may further include a plurality of structures and/or layers formed upon a semiconductor substrate. The structures and layers may include, but are not limited to, gate structures, local interconnect, vias, metallization layers, and dielectric layers formed upon the silicon substrate. Furthermore, the semiconductor topography may include diffusion regions or shallow trench isolation regions formed within a semiconductor substrate or within a layer formed upon a substrate. For example, a shallow trench isolation region may include a trench formed in a silicon substrate. A silicon nitride layer may be formed upon the silicon substrate and adjacent to the trenches. A pad oxide layer may also be formed upon the silicon substrate to promote adhesion of the silicon nitride layer to the silicon substrate. In addition, silicon dioxide, or another appropriate dielectric material, may be formed within the trench and upon the silicon nitride layer adjacent to the trenches.

The upper layer adjacent to the outer edge of the semiconductor topography, as described above, may include an intermetal dielectric layer or a polymetal dielectric layer. For example, the upper layer may include a dielectric material, such as silicon dioxide ($SiO_2$), tetraorthosilicate glass (TEOS), silicon nitride ($Si_xN_y$), silicon oxynitride ($SiO_xN_y(H_z)$), or silicon dioxide/silicon nitride/silicon dioxide (ONO). Additionally, the dielectrics may be undoped or may be doped, for example, with boron, phosphorus, boron and phosphorus, or fluorine, to form a doped dielectric layer such as borophosphosilicate glass (BPSG), phosphosilicate glass (PSG), and fluorinated silicate glass (FSG). The dielectrics may be deposited by physical deposition such as sputtering or by a variety of chemical deposition methods and chemistries such as chemical vapor deposition. Alternatively, the upper layer may include a conductive material such as polysilicon, a metal, such as aluminum, copper, or titanium, or a metal alloy, which may also be deposited by similar physical deposition and chemical deposition techniques.

In an additional embodiment, the upper layer may be formed upon a lower semiconductor layer having a plurality of nonplanar structures formed upon and spaced across the semiconductor topography. For example, the upper layer may include a dielectric layer conformally deposited over a plurality of trenches formed within and spaced across a semiconductor topography. Furthermore, the upper layer may be formed upon another substantially planar layer formed upon the semiconductor topography. In this manner, the upper layer may include a metallization layer overlying an entire semiconductor topography. In one embodiment, the upper layer may be formed upon and in contact with a polish stop layer. For example, the polish stop layer may be formed upon an upper surface of the semiconductor topography and adjacent to features formed in the semiconductor topography such as trenches. The polish stop layer may include, for example, silicon nitride. Appropriate materials for a polish stop layer, however, may also include any material having a substantially different polish response than the upper layer. In this manner, polishing may include exposing an upper surface of the polish stop layer. As such, subsequent to polishing, an upper surface of the upper layer within a trench formed in the semiconductor topography may be substantially coplanar with an upper surface of the polish stop layer. Alternatively, subsequent to polishing, an upper surface of the upper layer may be below an upper surface of a polish stop layer formed adjacent to the trench.

The method may also include forming a resist upon the upper layer and removing the resist in a region adjacent to the outer edge of the semiconductor topography to expose the upper layer prior to etching the portion of the upper layer in a region adjacent to the outer edge of the semiconductor topography. As such, the resist may be removed adjacent to the outer edge of the semiconductor topography such that the upper layer may be exposed and subsequently etched. In this manner, the resist may remain on the upper layer of the semiconductor topography to substantially mask the upper layer adjacent to the region to be preferentially removed. Thus, only the exposed portion of the upper layer adjacent to the outer edge of the semiconductor topography may be etched. A number of techniques may be used to remove the resist adjacent to the outer edge of the semiconductor topography. For example, an edge bead removal chemical may be applied to the resist adjacent to an outer edge of the semiconductor topography to remove the resist. Alternatively, the resist may be removed by exposing the resist adjacent to the outer edge of the semiconductor topography and applying a developer to the exposed portions. As such, removing the resist adjacent to an outer edge of the semiconductor topography may involve a chemical or an optical method. The resist may include a photoresist, such as a deep ultraviolet resist, an I-line resist, a G-line resist, or another resist, such as an e-beam resist or an x-ray resist.

The process of preferentially removing the upper layer may include removing a portion of the upper layer such that the upper layer in a region adjacent to the outer edge of the semiconductor topography may be recessed as compared to the thickness of other regions of the upper layer. For example, if the initial thickness of the upper layer is approximately 6,000 angstroms to approximately 10,000 angstroms, the method may include reducing a thickness of the upper layer by approximately 1,200 angstroms. In addition, a region of the upper layer extending greater than approximately 3 mm inward from the outer edge of the semiconductor topography may be removed. In one embodiment, the region of the upper layer extending laterally from the outer edge of the semiconductor topography may be approximately 6 mm. The initial thickness of the upper layer and a thickness of the removed portion of the upper layer may vary, however, depending on the design specifications of the device. For example, a thickness of the portion of the upper layer that is removed may be optimized such that a substantially planar upper surface of the semiconductor topography may be obtained subsequent to a polishing process. The etch process may include a wet etch process using HF and/or $NH_4F$. Alternatively, a plasma etch process may be employed which may involve using $CF_4$, $CHF_3$, $C_2F_6$, $SF_6$, $NF_3$, $O_2$, Ar, and $N_2$ as etchant gases. Subsequent to removing the upper layer adjacent to the outer edge of the semiconductor topography, the resist may be removed by a wet etch or stripping process.

As such, a semiconductor topography may include an upper layer formed conformally upon a non-planar lower semiconductor layer. An average thickness of the upper layer in a region adjacent to an outer edge of the semiconductor topography may be less than an average thickness of the upper layer in a region including a center of the topography. For example, the average thickness of the upper layer within the region adjacent to the outer edge of the semiconductor topography may be approximately 5% to approximately 30% less than the average thickness of the upper layer in a region including a center of the topography. The region may extend greater than approximately 3 mm inward from the outer edge of the semiconductor topography. In one embodiment, the region extending laterally from the outer edge of the semiconductor topography may be approximately 6 mm.

A thickness of the removed portion of the upper layer may depend on the initial thickness of the upper layer and a rate of a subsequent polishing step. Polishing may include a CMP process. Unfortunately, the polishing rate across a semiconductor topography may vary depending on a number of variables involved in a CMP process. For example, the polishing rate adjacent to the outer edge of the semiconductor topography may be slower than the polishing rate adjacent to the center of the semiconductor topography. A polishing rate discrepancy across a semiconductor topography may be determined by comparing a thickness of the upper layer across the semiconductor topography subsequent to polishing. Consequently, a thickness of the removed portion of the upper layer may be determined based on the polishing rate across a semiconductor topography such that a semiconductor topography having a substantially planar surface may be formed.

A substantially planar surface may have a thickness variation across the entirety of the polished semiconductor topography which does not vary substantially. For instance, the method as described herein may produce a substantially planar surface, which has a thickness variation across the entirety of the semiconductor topography, including a region adjacent to an outer edge of the semiconductor topography, of less than approximately 500 angstroms and more preferably less than approximately 120 angstroms. There may be several advantages to forming a substantially planar upper surface upon a semiconductor topography. For example, a semiconductor device may be formed approximately 4 mm from the outer edge of a semiconductor substrate. The formation of semiconductor devices within such a relatively close vicinity of the outer edge of the substrate may allow for an increase in the number of devices that may be formed upon a substrate. Such an increase in semiconductor device formation upon a substrate may increase manufacturing yield and may reduce production costs per semiconductor device.

A semiconductor topography formed by the method is also contemplated herein. The semiconductor topography may include a polished layer formed over a semiconductor wafer. The polished layer may include a plurality of structures laterally arranged across the semiconductor wafer. The structures may include, for example, gate structures, contact structures, local interconnect structures, conductive plugs, shallow trench isolation structures, dielectric layers, and conductive layers. A thickness of a structure arranged within a region adjacent to an outer edge of the semiconductor topography may differ by less than approximately 500 angstroms from a thickness of a corresponding structure arranged in a region including a center of the topography. In one embodiment, the thickness variation between a structure arranged within a region adjacent to an outer edge of the semiconductor topography and a corresponding structure arranged in a region including a center of the topography may vary by approximately 125 angstroms. The region adjacent to the outer edge may extend greater than approximately 3 mm laterally from the outer edge of the semiconductor topography. In one embodiment, the region extending laterally from the outer edge of the semiconductor topography may be approximately 6 mm. The structure arranged in a region adjacent to an outer edge may include at least a portion of a semiconductor device. Such a semiconductor topography may include, therefore, a semiconductor device arranged in a region approximately 4 mm extending laterally from the outer edge of the semiconductor topography.

BRIEF DESCRIPTION OF THE DRAWINGS

Other objects and advantages of the invention will become apparent upon reading the following detailed description and upon reference to the accompanying drawings in which.

Figure 1:
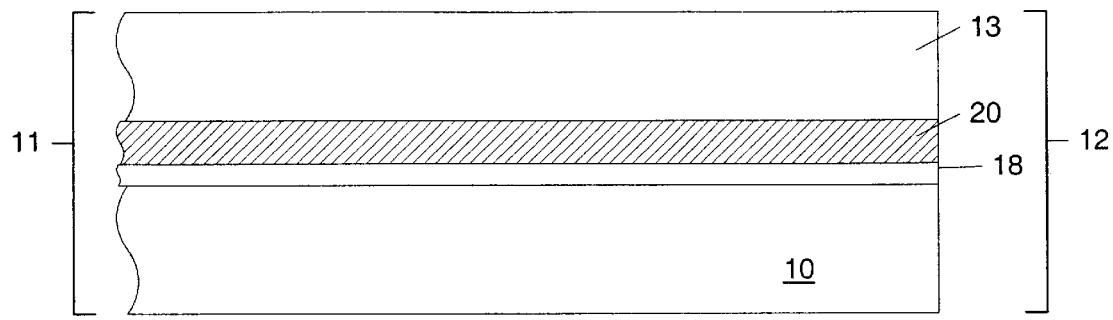
FIG. 1 depicts a partial cross-sectional view of a semiconductor topography in which an oxide layer, a polish stop layer, and a resist are formed upon a semiconductor layer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, an exemplary embodiment of a method for processing a semiconductor topography having a substantially planar surface is shown in FIGS. 1–10. FIG. 1 depicts a semiconductor topography in which oxide layer 18 may be formed upon and in contact semiconductor layer 10. Moreover, polish stop layer 20 may be formed upon and in contact with oxide layer 18, and resist 13 may be formed upon and in contact with polish stop layer 20. As illustrated in FIG. 1, lateral surface 11 of the semiconductor topography is drawn to indicate the continuation of the semiconductor topography toward a center portion of the semiconductor topography. On the contrary, lateral surface 12 of the semiconductor topography is drawn to indicate the outer edge of the semiconductor topography.

Semiconductor layer 10 may be a silicon substrate, and may be doped either n-type (for producing a p-channel transistor) or p-type (for an n-channel transistor). More specifically, semiconductor layer 10 may be an epitaxial silicon layer grown on a monocrystalline silicon substrate, or an n-type or p-type well region formed in a monocrystalline silicon substrate. Alternatively, semiconductor layer 10 may include structures and layers formed upon a semiconductor substrate, such as a monocrystalline silicon semiconductor substrate. The structures and layers may include, but are not limited to, gate dielectric layers, gate structures, contact structures, local interconnect wires, additional dielectric layers, or metallization layers. In this manner, semiconductor layer 10 may be substantially planar or may have substantial elevational differences due to the formation of such structures and layers. Diffusion regions (not shown) may also be formed in semiconductor layer 10. For example, diffusion regions may be lightly doped drain regions and heavily doped source/drain regions formed in a semiconductor layer adjacent to gate structures.

Oxide layer 18 may aid in the adhesion of polish stop layer 20 to semiconductor layer 10. For example, the inclusion of an oxide layer may promote adhesion of a silicon nitride layer, which may serve as polish stop layer 20, upon a silicon layer, which may serve as semiconductor layer 10. In another embodiment, oxide layer 18 may also serve as a "pad oxide" to reduce inherent stresses between a nitride polish stop layer and a silicon substrate. Oxide layer 18 may be grown upon semiconductor layer 10 using wet or dry thermal oxidation of a silicon substrate. Alternatively, oxide layer 18 may be deposited on semiconductor layer 10 using chemical-vapor deposition ("CVD") from, for example, a gas which may include $SiH_4$ and $O_2$. Oxide layer 18 may have a thickness of, for example, from approximately 50 angstroms to approximately 250 angstroms, preferably approximately 70 angstroms to approximately 150 angstroms, and in one embodiment, approximately 100 angstroms. Oxide layer 18 may include a dielectric layer, such as silicon dioxide ($SiO_2$), tetraorthosilicate glass (TEOS), or silicon dioxide/silicon nitride/silicon dioxide (ONO). Alternatively, polish stop layer 20 may be formed upon semiconductor layer 10 without oxide layer 18.

Polish stop layer 20 may serve to protect portions of underlying layers and structures within semiconductor layer 10. For example, polish stop layer 20 may protect portions of oxide layer 18 and semiconductor 10 from an etch process which may be used to form trenches within semiconductor layer 10. Polish stop layer 20 may also serve as a stop layer for polishing processes as described herein. In this manner, the polishing of overlying layers may be substantially terminated upon exposing polish stop layer 20. Consequently, structures or layers for the with semiconductor layer 10 adjacent to polish stop layer 20 may also be polished to approximately the same elevation level as polish stop layer 20. Alternatively, structures or layers for the with semiconductor layer 10 adjacent to polish stop layer 20 may also be recessed to an elevational level below polish stop layer 20.

Polish stop layer 20 may include silicon nitride deposited by thermally decomposing silane or dichlorosilane and ammonia in a chemical vapor deposition process maintained at a temperature in the range of approximately 200° C. to approximately 800° C. Appropriate materials for polish stop layer 20, however, may also include any material having a substantially different polish response than upper layer 22. Polish stop layer 20 may have, for example, a thickness from approximately 500 angstroms to approximately 2,000 angstroms and preferably approximately 1,200 angstroms to approximately 1,700 angstroms.

Figure 2:
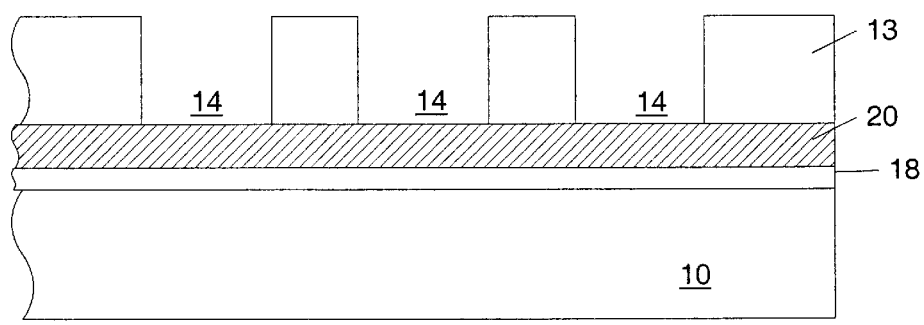
FIG. 2 depicts a partial cross-sectional view of a semiconductor topography in which the resist is patterned subsequent to FIG. 1.
Figure 3:
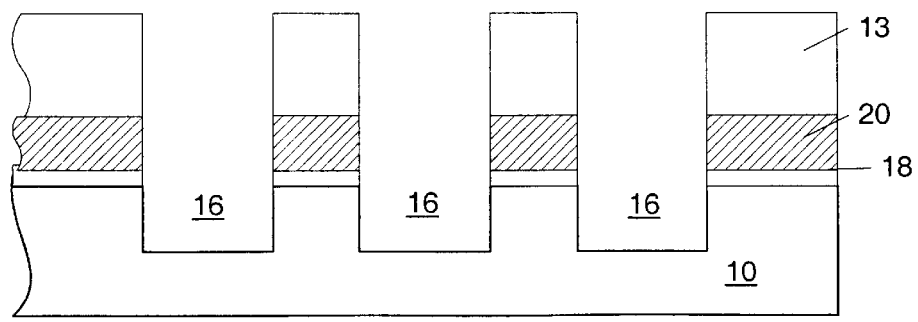
FIG. 3 depicts a partial cross-sectional view of a semiconductor topography in which trenches are formed within the semiconductor layer subsequent to FIG. 2.

In an embodiment, resist 13 may be formed upon polish stop layer 20. Resist 13 may include a photoresist, such as a deep ultraviolet resist, an I-line resist, a G-line resist, or another resist, such as an e-beam resist or an x-ray resist. Resist 13 may be patterned using a lithography technique, thus exposing portions 14 of polish stop layer 20 as shown in FIG. 2. Exposed portions 14 of polish stop layer 20 and underlying portions of oxide layer 18 and semiconductor layer 10 may be etched to form trenches 16 as shown in FIG. 3. The etch process may include wet etch and/or dry etch techniques. The patterned photoresist may then be removed by a stripping process such as a wet etch or a reactive ion etch stripping process. Trenches 16 may be used to form shallow trench isolation regions within semiconductor layer 10. Additional isolation regions may be formed by a number of techniques such as recessed oxide isolation (ROI) or local oxidation of silicon (LOCOS) to form regions of undoped silicon dioxide in semiconductor layer 10. Isolation regions may be field oxide regions, which may serve to isolate separate active regions on semiconductor layer 10 from one another.

Figure 4:
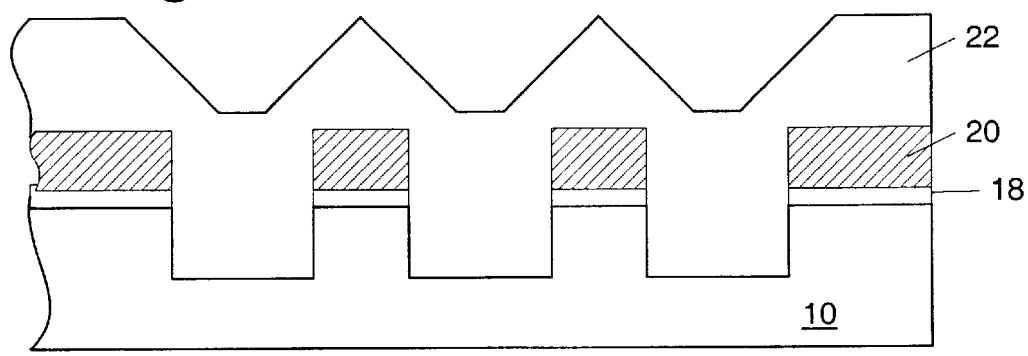
FIG. 4 depicts a partial cross-sectional view of a semiconductor topography in which an upper layer is formed within the trenches and above the polish stop layer subsequent to FIG. 3.

Trenches 16 may be filled with upper layer 22 as shown in FIG. 4. Upper layer 22 may also be formed upon an upper surface of polish stop layer 20, which may be formed adjacent to trenches 16. Generally, upper layer 22 may be deposited conformally and thus, may have a non-planar upper surface as shown in FIG. 4. The planarity of the upper layer may be defined by the thickness variation of the upper layer across the entirety of the semiconductor topography with respect to an underlying plane within the topography. On the other hand, the planarity of the upper layer may be determined by measuring an average thickness of the layer in one region of the semiconductor topography as compared to the average thickness of the layer in another region of the semiconductor topography. Alternatively, upper layer 22 may be relatively planar if the underlying structures and layers are substantially planar before the deposition of upper layer 22. The thickness of upper layer 22 may be approximately 6,000 angstroms to approximately 10,000 angstroms. Larger or smaller thicknesses of upper layer 22, however, may be appropriate depending on the semiconductor device being formed.

In an embodiment, upper layer 22 may include a polymetal dielectric layer or an intermetal dielectric layer. For example, upper layer 22 may include silicon dioxide ($SiO_2$), tetraorthosilicate glass (TEOS), silicon nitride ($Si_xN_y$), silicon oxynitride ($SiO_xN_y(H_z)$), or silicon dioxide/silicon nitride/silicon dioxide (ONO). In addition, upper layer 22 may be silicon dioxide deposited by a CVD process, which may be nitrided in a subsequent processing step. Silicon nitride and silicon oxynitride may be formed by a CVD process using a silicon source, such as silane, chlorosilane ($SiH_xCl_y$), or dichlorosilane ($SiCl_2H_2$), and a nitrogen source, such as nitrogen ($N_2$), nitrous oxide ($N_2O$), and ammonia ($NH_3$). Deposition of silicon nitride may be performed at a substrate temperature of about 600° C. to about 950° C., a deposition chamber pressure of approximately 5 mT to approximately 500 mT, and for a period of time of approximately 20 minutes to approximately 100 minutes. In addition, decomposition of tetraethyl orthosilicate (TEOS) may be performed in a plasma-enhanced CVD (PECVD) reactor at a substrate temperature of about 200° C. to about 500° C. to produce a very conformal film. Other techniques that may be used to deposit silicon dioxide for upper layer 22 may include PECVD using a silane source, atmospheric-pressure CVD (APCVD), and low-pressure CVD (LPCVD) using silane or TEOS sources. In addition, upper layer 22 may be formed from a low-permittivity ("low-k") dielectric, generally known in the art as a dielectric having a dielectric constant of less than about 3.5. One low-k dielectric in current use, which is believed to make a conformal film, is fluorine-doped silicon dioxide. In another embodiment, upper layer 22 may be formed from a high-permittivity ("high-k") dielectric. Appropriate materials for a high-k gate dielectric include, but are not limited to, tantalum pentoxide ($Ta_2O_5$), barium titanate ($BaTiO_3$), and titanium oxide ($TiO_2$).

Upper layer 22 may also be undoped or may be doped to form, for example, low doped BPSG, low doped PSG, or FSG. Low doped BPSG may have a boron concentration of less than approximately 5% by weight. Low doped PSG may have a phosphorus concentration of less than approximately 6% by weight, and more preferably less than approximately 5% by weight. In an embodiment, upper layer 22 may be deposited by a medium density or a high density plasma (HDP) deposition technique. For example, a high density plasma may include a charge density that generally exceeds that used in conventional plasma enhanced and plasma assisted chemical vapor deposition (PECVD and PACVD). For example, a high density plasma may include a charge density that exceeds that which may be used to deposit conventional PECVD BPSG layers such as charge densities which may generally exceed approximately $10^7$ charged particles per $cm^3$.

In addition, a high density plasma may have a low frequency power in a range of approximately 4000 W to approximately 4500 W, and a high frequency power in a range of approximately 1200 W to approximately 1500 W. Furthermore, a HDP PSG layer may be formed from a plasma which may include a mixture of a silicon source such as silane or chlorosilane, an oxygen source such as oxygen, ozone, or nitrous oxide, and a phosphorus source such as phosphine, methyl phosphine, or ethyl phosphine. For example, a silicon source may flow into a plasma chamber at a rate of approximately 5 to 100 standard cubic centimeters per minute (sccm). An oxygen source may flow into the plasma chamber at a rate of approximately 20 sccm to approximately 1000 sccm, and a phosphorus source may flow into the plasma chamber at a rate of approximately 10 sccm to approximately 500 sccm. In addition, argon may also flow into the plasma chamber at a rate of approximately 25 sccm to approximately 40 sccm. The flow ratios of the silicon and phosphorus sources may be selected in a range from approximately 1:20 to approximately 1:2.

Alternatively, upper layer 22 may include a conductive material, such as polysilicon, aluminum, copper, titanium, or a metal alloy. For example, aluminum may be deposited by physical vapor deposition (PVD) using an aluminum target. A chemical vapor deposition (CVD) process may also be used to deposit aluminum by the pyrolysis of triisobutyl aluminum (TIBA) in a reactor chamber maintained at a temperature of approximately 250° C. and a pressure less than approximately 1 torr. Polysilicon may be deposited by using a CVD process involving deposition of silicon from a silane source. In addition, upper layer 22 may be deposited using a technique such as atmospheric pressure chemical vapor deposition (APCVD), low pressure chemical vapor deposition (LPCVD), plasma-enhanced chemical vapor deposition (PECVD), and conventional sputtering.

Furthermore, because copper diffuses readily through silicon and oxide, and undesirably alters the electrical properties of transistors formed in silicon, a liner may be deposited on the semiconductor layer before deposition of a copper layer. A liner may preferably be formed from a conductive material, which acts as a diffusion barrier to the overlying copper, and also adheres well to semiconductor layer 10. Materials typically used as a liner, which is often called a diffusion barrier and/or an adhesion layer, may include metal nitrides such as titanium nitride and tantalum nitride, and refractory alloys such as titanium-tungsten. A copper layer may be typically formed using two deposition steps. A thin "seed" layer may be deposited first, followed by a more rapid "fill" deposition. The seed layer may be deposited by sputtering, but other methods such as CVD may also be used. Electroplating is a currently preferred method of depositing a copper layer, but other techniques, including CVD, may be used as well.

Figure 5:
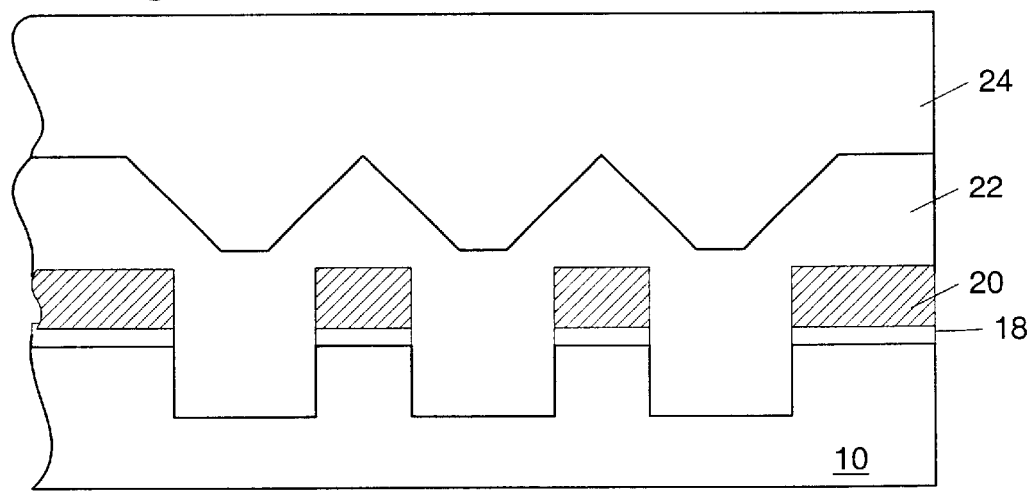
FIG. 5 depicts a partial cross-sectional view of a semiconductor topography in which a resist layer is formed subsequent to FIG. 4.
Figure 6:
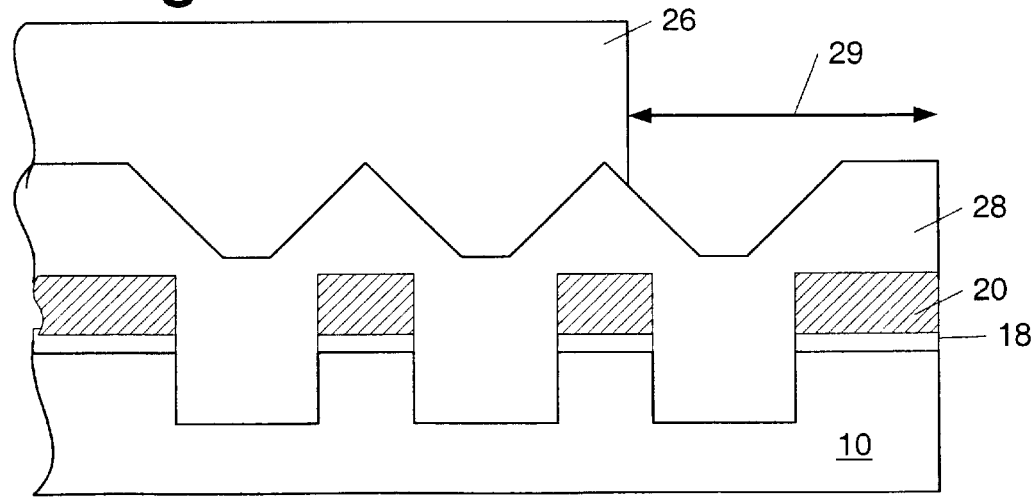
FIG. 6 depicts a partial cross-sectional view of a semiconductor topography in which a portion of the resist layer in a region adjacent to an outer edge of the semiconductor topography is removed subsequent to FIG. 5.
Figure 7:
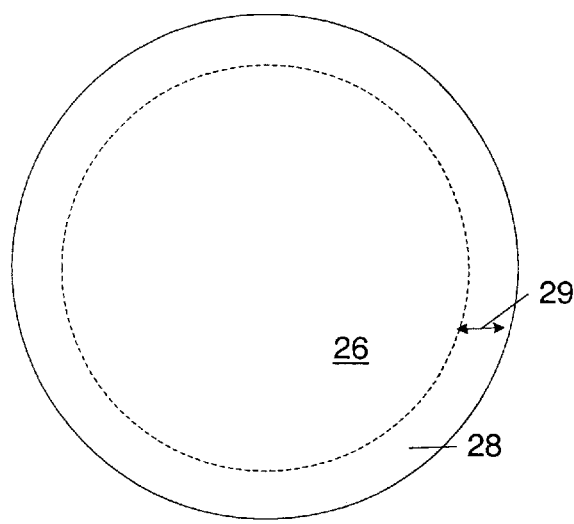
FIG. 7 depicts a top view of the semiconductor topography of FIG. 6 in which the topography includes a semiconductor wafer.

Resist layer 24 may be formed upon upper layer 22 as shown in FIG. 5. Resist layer 24 may include any of the resist materials as described above. Resist layer 24 may be removed adjacent to the outer edge of the semiconductor topography as shown in FIG. 6. Width 29 of the removed portion of resist layer 24 may be approximately greater than 3 mm extending laterally from the outer edge of the semiconductor topography. In an embodiment, width 29 of the removed portion extending laterally from the outer edge of the semiconductor topography may be approximately 6 mm. Consequently, removing a portion of the resist at the outer edge of the semiconductor topography may expose an outer edge portion 28 of upper layer 22. The width of outer edge portion 28 may be approximately equal to the width of the removed portion of the resist layer 24. As such, the outer edge portion 28 in the aforementioned embodiment may extend approximately greater than 3 mm inward from the outer edge of the semiconductor topography. In this manner, portion 26 of resist layer 24 may remain above upper layer 22 adjacent to outer edge portion 28. Portion 26 may extend across a portion of the semiconductor topography which includes a center of the topography. FIG. 7 illustrates a top view of the semiconductor topography of FIG. 6, wherein the topography includes a semiconductor wafer. Portion 26 includes the portion of resist layer 24 adjacent to the portion of the resist that has been removed. Thus, outer edge portion 28 of upper layer 22 may include an exposed region adjacent to the periphery of the wafer. As stated above, width 29 of outer edge portion 28 may extend greater than approximately 3 mm inward from the outer edge of the semiconductor topography.

The removal of the portion of resist layer 24 adjacent to the outer edge of the semiconductor topography may include applying edge bead removal chemicals to the resist adjacent to the outer edge of the semiconductor topography. Such edge bead removal chemicals may be applied to an outer edge of a wafer subsequent to coating a resist during a lithography process to remove small amounts of resist from the edge of a wafer. In this manner, contamination of tools used to process the wafer subsequent to coating a resist may be prevented. In such a lithography process, an edge bead chemical, however, may be applied to a width of less than approximately 2 mm extending laterally from an outer edge of a semiconductor topography. Therefore, applying an edge bead removal chemical in such a lithography process is substantially different and unsuitable for removing a portion of resist layer 24 as described herein. For example, typically, a minimal amount of edge bead removal chemical may be applied to the resist to prevent contamination. As such, contamination of process tools during subsequent processing may be prevented while minimizing the amount of resist which is removed such that structures of semiconductor devices may be patterned as close to the outer edge of the semiconductor topography as possible and across the largest area of the semiconductor topography as possible.

Alternatively, removing a portion of resist layer 24 adjacent to the outer edge of the semiconductor topography may include exposing the resist in a region adjacent to the outer edge of the topography using a lithography technique and applying a developer to resist layer 24. An appropriate lithography technique may be selected depending on the resist used for resist layer 24. The developer may include an aqueous solution, which may dissolve only exposed portions of the resist, thereby leaving unexposed regions of the resist substantially intact. Appropriate developers may be selected depending on the type of resist used for resist layer 24.

Figure 8:
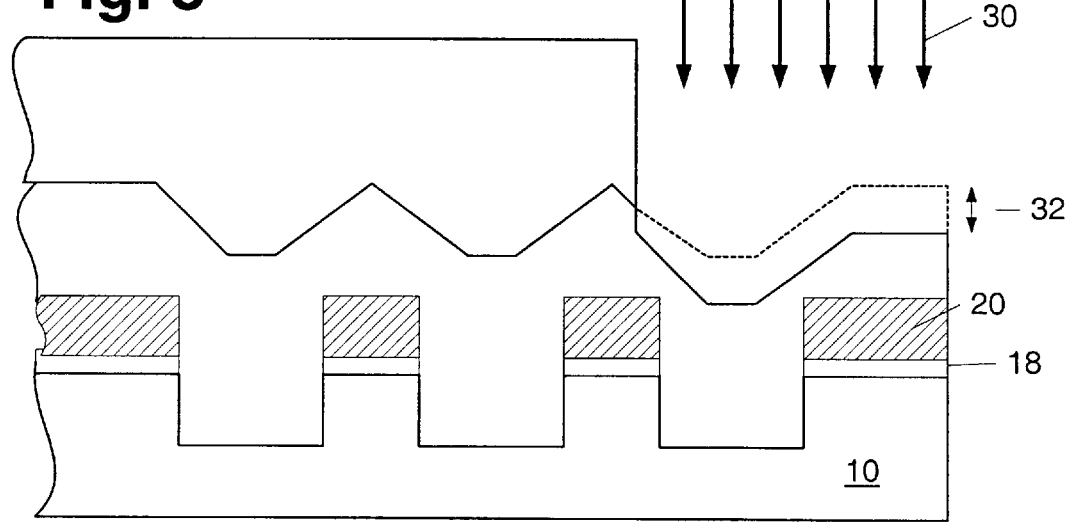
FIG. 8 depicts a partial cross-sectional view of a semiconductor topography in which a portion of the upper layer in a region adjacent to the outer edge of the semiconductor topography is removed subsequent to FIG. 6.

FIG. 8 illustrates removal process 30 which may include preferentially removing a portion of outer edge portion 28 such that the thickness of upper layer 22 adjacent to the outer edge of the semiconductor topography may be decreased. In one embodiment, the removal process may remove thickness 32, which may be approximately 5% to approximately 30% of the average thickness of outer edge portion 28. However, an appropriate thickness may be selected such that a substantially planar surface may be obtained after a subsequent polish as described in further embodiments. The removal process may include a wet etch process using HF and/or $NH_4F$. Alternatively, a plasma etch process may be employed which may involve using $CF_4$, $CHF_3$, $C_2F_6$, $SF_6$, $NF_3$, $O_2$, Ar, and $N_2$ as etchant gases. Remaining portion 26 of resist layer 24 may be removed subsequent to preferentially removing a portion of outer edge portion 28 of upper layer 22 as shown in FIG. 9 by a wet etch stripping process or a reactive ion stripping process.

Figure 9:
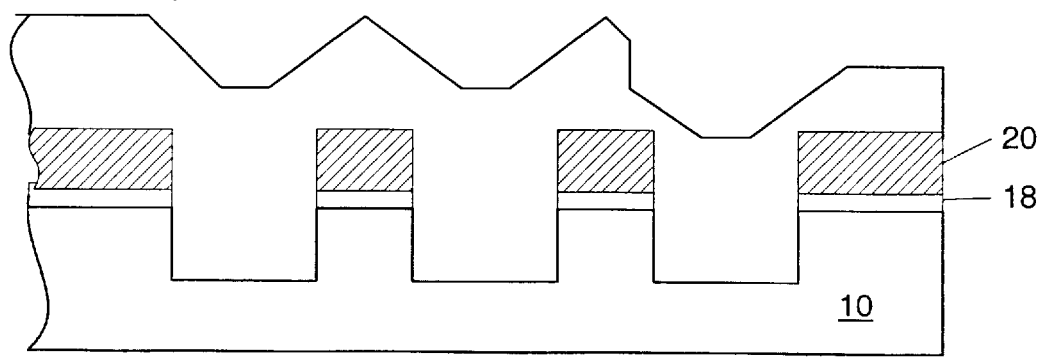
FIG. 9 depicts a partial cross-sectional view of a semiconductor topography in which the resist layer is removed subsequent to FIG. 8.

Thus, FIG. 9 may illustrate a semiconductor topography with upper layer 22 formed conformally upon a non-planar lower layer. Moreover, an average thickness of upper layer 22 in a region adjacent to an outer edge of the semiconductor topography may be less than an average thickness of upper layer 22 in a region including a center of the topography. For example, the average thickness of upper layer 22 within the region adjacent to the outer edge of the semiconductor topography may be approximately 5% to approximately 30% less than the average thickness of upper layer 22 in a region including a center of the topography. The region adjacent to the outer edge of the semiconductor topography may extend greater than approximately 3 mm and may preferably extend approximately 6 mm inward from the outer edge. The top view of such a topography may look substantially similar to FIG. 7, in which a top view of a semiconductor topography with an etched outer edge is shown. The preferentially removed portion of upper layer 22 shown in FIG. 9 may be arranged adjacent to the periphery of the semiconductor topography, as edge portion 28 is shown in FIG. 7.

Figure 10:
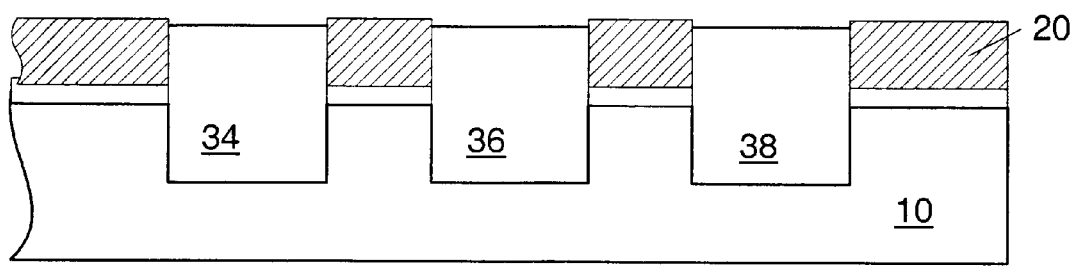
FIG. 10 depicts a partial cross-sectional view of a semiconductor topography in which the semiconductor topography is polished subsequent to FIG. 9 to form a substantially planar upper surface.

The upper surface of upper layer 22 may be polished such that the upper surface of the semiconductor topography may be substantially planar as illustrated in FIG. 10. Chemical and mechanical abrasion may be used as the polishing process to planarize and remove surface irregularities of a semiconductor topography and is commonly referred to as chemical-mechanical polishing ("CMP"). A typical CMP process may involve placing a semiconductor topography face-down on a polishing pad which may be fixedly attached to a rotatable table or platen. Elevationally extending features of the semiconductor topography are positioned such that they may contact a chemical slurry attributed to the CMP process. The polishing pad may be made of various substances, depending on the material being polished. A popular polishing pad medium includes polyurethane or polyurethane-impregnated polyester felts. During the CMP process, the polishing pad and the semiconductor topography may be rotated while a carrier holding the semiconductor topography applies a downward force upon the polishing pad. An abrasive, fluid-based chemical, often referred to as a "slurry", may be deposited upon the surface of the polishing pad. The slurry may occupy an interface between the polishing pad and the surface of the semiconductor topography. The slurry may initiate the polishing process by chemically reacting with the surface material being polished. The rotational movement of the polishing pad relative to the semiconductor topography may cause abrasive particles entrained within the slurry to physically strip the reacted surface material from the semiconductor topography. The abrasive slurry particles may be composed of silica, alumina, or ceria. Alternatively, a slurry solution substantially absent of abrasive particles may be used. Some factors that may influence the effect of the slurry solution include pH of the solution, the flow dynamics at the pad and semiconductor topography interface, and the etch selectivity of the slurry with respect to materials within the semiconductor topography. A post-CMP cleaning step may be required to remove residual slurry particles from the surface of the polished topography.

The method as described herein may include a slower rate of polishing adjacent to the outer edge of the semiconductor topography than that of the polishing rate at the center of the semiconductor topography. However, since a portion of upper layer 22 within a region extending laterally from an outer edge of the semiconductor topography may have been removed, a substantially planar surface may be obtained across the semiconductor surface. In addition, a semiconductor device may be arranged within the region adjacent to the outer edge of the semiconductor topography. More particularly, a semiconductor device may be arranged approximately 4 mm from the outer edge of a semiconductor topography. Furthermore, an average thickness of a polished upper layer in a region adjacent to an outer edge of the semiconductor topography may be approximately equal to an average thickness of the polished upper layer in a region including a center of the topography. In one embodiment, a thickness variation of a polished upper layer across the entirety of the semiconductor topography may be less than approximately 500 angstroms. In another embodiment, the thickness variation of a polished upper layer across the entirety of the semiconductor topography may be less than approximately 125 angstroms. The polishing process may include exposing an upper surface of polish stop layer 20. As such, other structures and layers may be elevationally adjacent to polish stop layer 20 subsequent to the polishing process. In FIG. 10, upper layer 22 may be formed within trenches 16 to form, for example, shallow isolation regions 34, 36, and 38. Thus, the polished upper surface of the upper layer within the isolation trenches may be coplanar with an upper surface of polish stop layer 20 formed adjacent to isolation regions 34, 36, and 38. Alternatively, the polishing process may include polishing the upper surface of the upper layer to a level spaced above or below the polish stop layer.

As such, FIG. 10 may illustrate a semiconductor topography which may include polished upper layer 20 formed upon a semiconductor wafer. Shallow isolation regions 34, 36, and 38 may be arranged within polished upper layer 20, laterally across the semiconductor topography. A thickness of shallow isolation region 38 arranged within a region adjacent to an outer edge of the semiconductor topography may differ by less than approximately 500 angstroms compared to thicknesses of shallow isolation regions 34 and 36 arranged adjacent to the region. Furthermore, a thickness of shallow isolation region 38 arranged within a region adjacent to an outer edge of the semiconductor topography may differ by less than approximately 125 angstroms compared to thicknesses of shallow isolation regions 34 and 36 arranged adjacent to the region. The region in which shallow isolation region 38 may be arranged may be greater than approximately 3 mm extending laterally from the outer edge of the semiconductor topography. In particular, the region in which shallow isolation region 38 may be arranged may be approximately 6 mm extending laterally from the outer edge of the semiconductor topography. In one embodiment, shallow isolation region 38 arranged in a region adjacent to an outer edge of the semiconductor topography may include at least a portion of a semiconductor device. A wafer with such a semiconductor topography may include, therefore, a semiconductor device arranged in a region approximately 4 mm from the outer edge of the semiconductor topography.

It will be appreciated to those skilled in the art having the benefit of this disclosure that this invention is believed to provide a method for processing a semiconductor topography having a substantially planar upper surface. Further modifications and alternative embodiments of various aspects of the invention will be apparent to those skilled in the art in view of this description. For example, the methods described herein could be applied not just to forming a substantially planar surface above a shallow isolation trench, but to forming any semiconductor feature or layer which may include polishing a material to produce a substantially planar surface. For example, the method described herein may be used in a dual damascene process in which an interconnect trench and a contact opening may be formed simultaneously in a dielectric layer with a substantially planar upper surface. It is intended that the following claims be interpreted to embrace all such modifications and changes and, accordingly, the specification and drawings are to be regarded in an illustrative rather than a restrictive sense.

What is claimed is:

1. A method for processing a semiconductor topography, comprising:

preferentially removing, in a region adjacent to an outer edge of the semiconductor topography, a first portion of an upper layer of the topography such that a second portion of the upper layer remains in the region extending outward to the outer edge of the semiconductor topography after said preferentially removing; and subsequently polishing the upper layer such that its upper surface is substantially planar.

2. The method of claim 1, wherein the first portion extends greater than approximately 3 mm inward from the outer edge of the semiconductor topography.

3. The method of claim 1, wherein the first portion extends approximately 6 mm inward from the outer edge of the semiconductor topography.

4. The method of claim 1, wherein said preferentially removing comprises etching the portion of the upper layer.

5. The method of claim 1, wherein a thickness variation of a polished upper layer across the entirety of the semiconductor topography is less than approximately 500 angstroms.

6. The method of claim 1, wherein the thickness variation of a polished upper layer of the semiconductor topography is less than approximately 125 angstroms.

7. The method of claim 1, wherein said upper layer comprises a conductive material.

8. The method of claim 1, wherein said upper layer comprises a dielectric.

9. The method of claim 1, wherein said upper layer is formed upon and in contact with a polish stop layer prior to said removing, and wherein said polishing comprises exposing an upper surface of the polish stop layer.

10. The method of claim 1, wherein the upper layer is formed within a trench in the semiconductor topography, and wherein an upper surface of the upper layer in the trench is coplanar with an upper surface of a polish stop layer formed adjacent to the trench subsequent to said polishing.

11. The method of claim 1, wherein the upper layer is formed within a trench in the semiconductor topography, and wherein an upper surface of the upper layer in the trench is below an upper surface of a polish stop layer formed adjacent to the trench subsequent to said polishing.

12. The method of claim 4, further comprising forming a resist upon the upper layer and removing the resist in the region adjacent to the outer edge of the semiconductor topography to expose the first portion of the upper layer prior to said etching.

13. The method of claim 12, wherein said removing the resist comprises applying an edge bead removal chemical to the resist in the region adjacent to the outer edge of the semiconductor topography.

14. The method of claim 12, wherein said removing the resist comprises exposing the resist in a region adjacent to the outer edge of the semiconductor topography and applying a developer to the resist.

15. The method of claim 12, further comprising stripping the resist prior to said polishing.

16. The method of claim 1, wherein the average thickness of the first portion is approximately 5% to approximately 30% of the initial average thickness of the upper layer in the region.

17. The method of claim 1, wherein a rate of said polishing in the region adjacent to the outer edge of the semiconductor topography is slower than a rate of said polishing adjacent to a center of the semiconductor topography.

18. A method for processing a semiconductor topography, comprising:

preferentially removing, in a region extending outward to an outer edge of the semiconductor topography adjacent to the outer edge of the semiconductor topography, a portion of a dielectric layer of the topography; and polishing the semiconductor topography such that its upper surface is substantially planar, wherein said polishing is conducted substantially in succession to said preferentially removing.

19. The method of claim 18, wherein said preferentially removing comprises etching the portion of the upper layer.

20. The method of claim 18, wherein a rate of said polishing in the region adjacent to the outer edge of the semiconductor topography is slower than a rate of said polishing adjacent to a center of the semiconductor topography.

* * * * *